(12) United States Patent
Wu et al.

(10) Patent No.: US 12,105,312 B1
(45) Date of Patent: Oct. 1, 2024

(54) LIGHT EMITTING MODULE FOR LUMINOUS KEYBOARD

(71) Applicant: SUNREX TECHNOLOGY CORP., Taichung (TW)

(72) Inventors: Chih-Hsien Wu, Taichung (TW); Shih-Pin Lin, Taichung (TW); Li-Ling Huang, Taichung (TW); Zhi-Xuan Zhang, Taichung (TW)

(73) Assignee: Sunrex Technology Corp., Taichung (TW)

( * ) Notice: Subject to any disclaimer, the term of this patent is extended or adjusted under 35 U.S.C. 154(b) by 0 days.

(21) Appl. No.: 18/617,231

(22) Filed: Mar. 26, 2024

(30) Foreign Application Priority Data

Jan. 30, 2024 (TW) .................................. 113103562

(51) Int. Cl.
  *F21V 8/00* (2006.01)
  *H01L 33/60* (2010.01)
  *H01L 25/075* (2006.01)

(52) U.S. Cl.
  CPC ............ *G02B 6/0036* (2013.01); *G02B 6/006* (2013.01); *H01L 33/60* (2013.01); *H01L 25/0753* (2013.01)

(58) Field of Classification Search
  CPC ........ G02B 6/0036; G02B 6/006; H01L 33/60
  See application file for complete search history.

(56) References Cited

U.S. PATENT DOCUMENTS

| | | | |
|---|---|---|---|
| 9,214,301 B2 * | 12/2015 | Chen | H01H 3/125 |
| 11,175,444 B1 * | 11/2021 | Pan | G02B 6/0088 |
| 2018/0106956 A1 * | 4/2018 | Wang | G02B 6/0068 |
| 2021/0012984 A1 * | 1/2021 | Chen | H01H 13/83 |
| 2021/0082642 A1 * | 3/2021 | Ho | H01H 13/705 |
| 2024/0096568 A1 * | 3/2024 | Huang | G02B 6/0021 |

* cited by examiner

*Primary Examiner* — Evan P Dzierzynski
(74) *Attorney, Agent, or Firm* — Burris Law, PLLC

(57) ABSTRACT

A light emitting module includes a light-guiding plate disposed under a light-shielding plate that includes a light-shielding portion and a hollow unit. The light-guiding plate has a light-exiting surface, a bottom surface, and a light-entering surface unit. The light-exiting surface has a base portion and a light-mixing portion. The light-mixing portion is formed on the base portion, is disposed within the hollow unit, and has refracting segments. Each of the refracting segments extends and tapers upwardly from the base portion. A reflection plate is disposed under the bottom surface. A plurality of light emitting members are disposed below the light-shielding portion. The light-entering surface unit faces the light emitting members.

8 Claims, 6 Drawing Sheets

LIGHT EMITTING MODULE FOR LUMINOUS KEYBOARD

CROSS-REFERENCE TO RELATED APPLICATION

This application claims priority to Taiwanese Invention Patent Application No. 113103562, filed on Jan. 30, 2024, the entire disclosure of which is incorporated by reference herein.

FIELD

The disclosure relates to a light emitting module, and more particularly to a light emitting module adapted to be mounted in a luminous keyboard.

BACKGROUND

An existing light emitting module adapted for a luminous keyboard includes a reflection plate, a light-guiding plate disposed on the reflection plate, a light-shielding plate disposed on the light-guiding plate, and a light source unit. The light-shielding plate has a plurality of hollow regions that are respectively located corresponding to keycaps of the luminous keyboard. The light source unit includes a plurality of light emitting diodes that sideward illuminate the light-guiding plate. Each of the light emitting diodes may emit one of red light, green light, and blue light so that the light rays from the light emitting diodes may be mixed into different color beams. The light beams mixed from the light emitting diodes are reflected by the reflection plate and pass through the light-guiding plate and the hollow regions to illuminate the keycaps.

However, regarding the hollow regions disposed adjacent to the light emitting diodes, the light rays from the light emitting diodes may be incompletely mixed, thereby causing an inaccurate color light combination. Especially, during emission of a white beam, colors of red, green, and blue may be appeared within the white beam in a motley manner. With regard to a laptop computer having a relatively small size, because the light emitting diodes are disposed close to some of the hollow regions, the inaccurate color light combination caused by the light rays from the light emitting diodes may be conspicuous, thereby adversely affecting a luminous effect of the luminous keyboard.

SUMMARY

Therefore, one object of the disclosure is to provide a light emitting module that can alleviate at least one of the drawbacks of the prior art.

According to the disclosure, the light emitting module includes a light-shielding plate, a light-guiding plate, a reflection plate, and a light source unit.

The light-shielding plate includes a light-shielding portion and a hollow unit that is formed in the light-shielding portion. The hollow unit extends through the light-shielding portion in a top-bottom direction.

The light-guiding plate is made of a light permeable material and disposed under the light-shielding plate. The light-guiding plate has a light-exiting surface, a bottom surface, and a light-entering surface unit. The light-exiting surface is disposed adjacent to the light-shielding plate, and has a base portion and at least one light-mixing portion. The at least one light-mixing portion is formed on the base portion, is disposed within the hollow unit, and has a plurality of refracting segments. Each of the refracting segments extends and tapers upwardly from the base portion in the top-bottom direction. The bottom surface is opposite to the light-exiting surface. The light-entering surface unit is connected between the light-exiting surface and the bottom surface.

The reflection plate is disposed under the bottom surface.

The light source unit includes a plurality of light emitting members that are disposed below the light-shielding portion. The light-entering surface unit faces the light emitting members.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
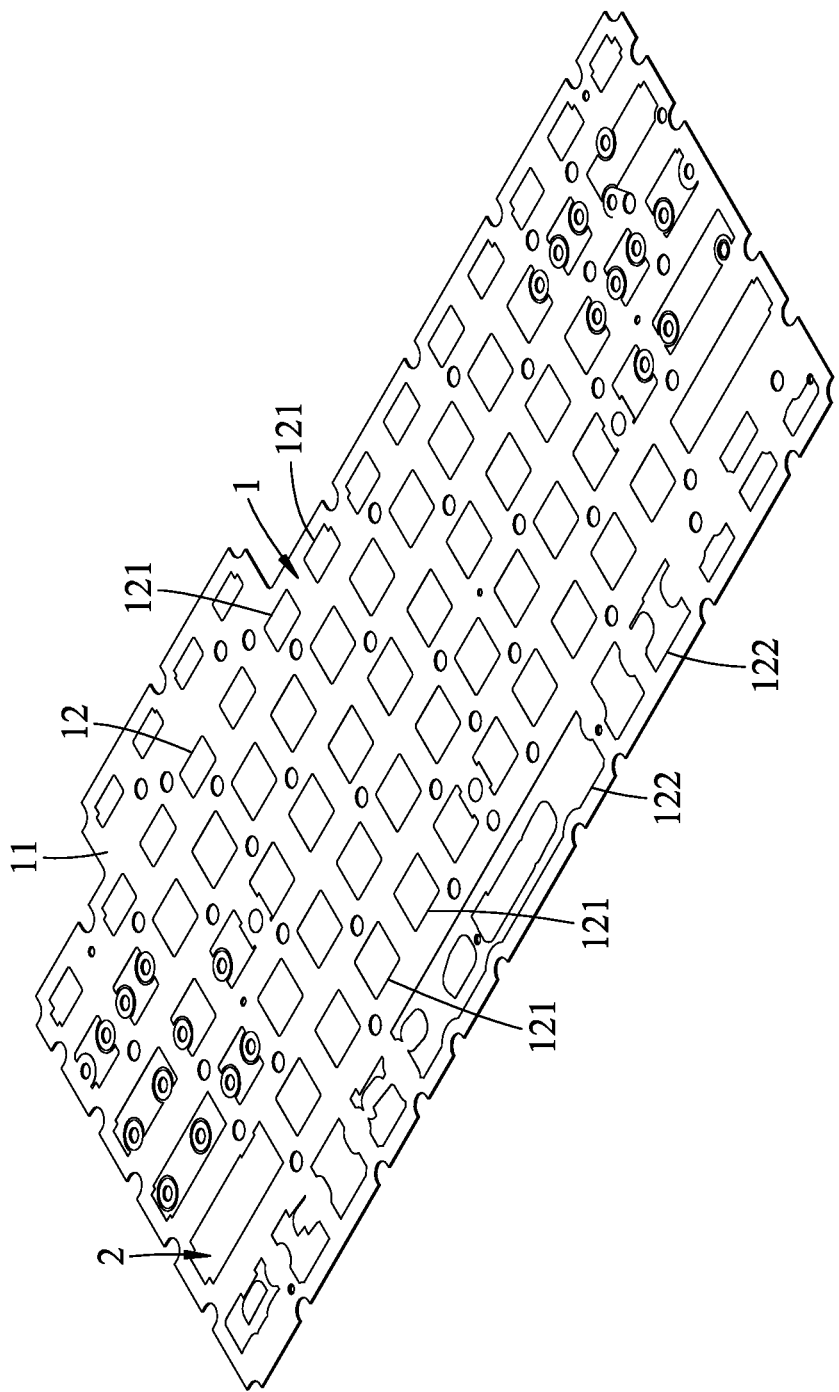
FIG. 1 a perspective view illustrating a light emitting module of an embodiment according to the disclosure adapted to be mounted in a luminous keyboard.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
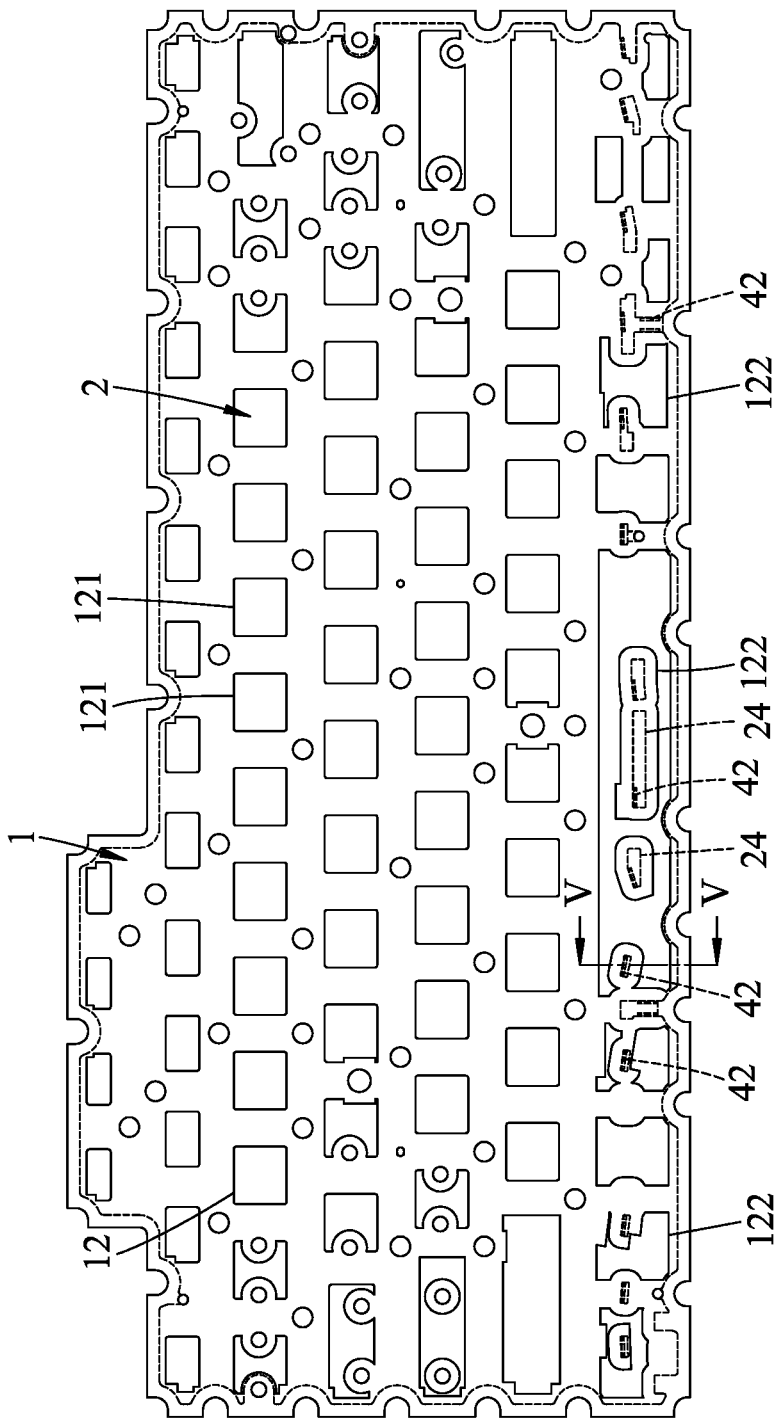
FIG. 2 is a top view of the embodiment.
Figure 3:
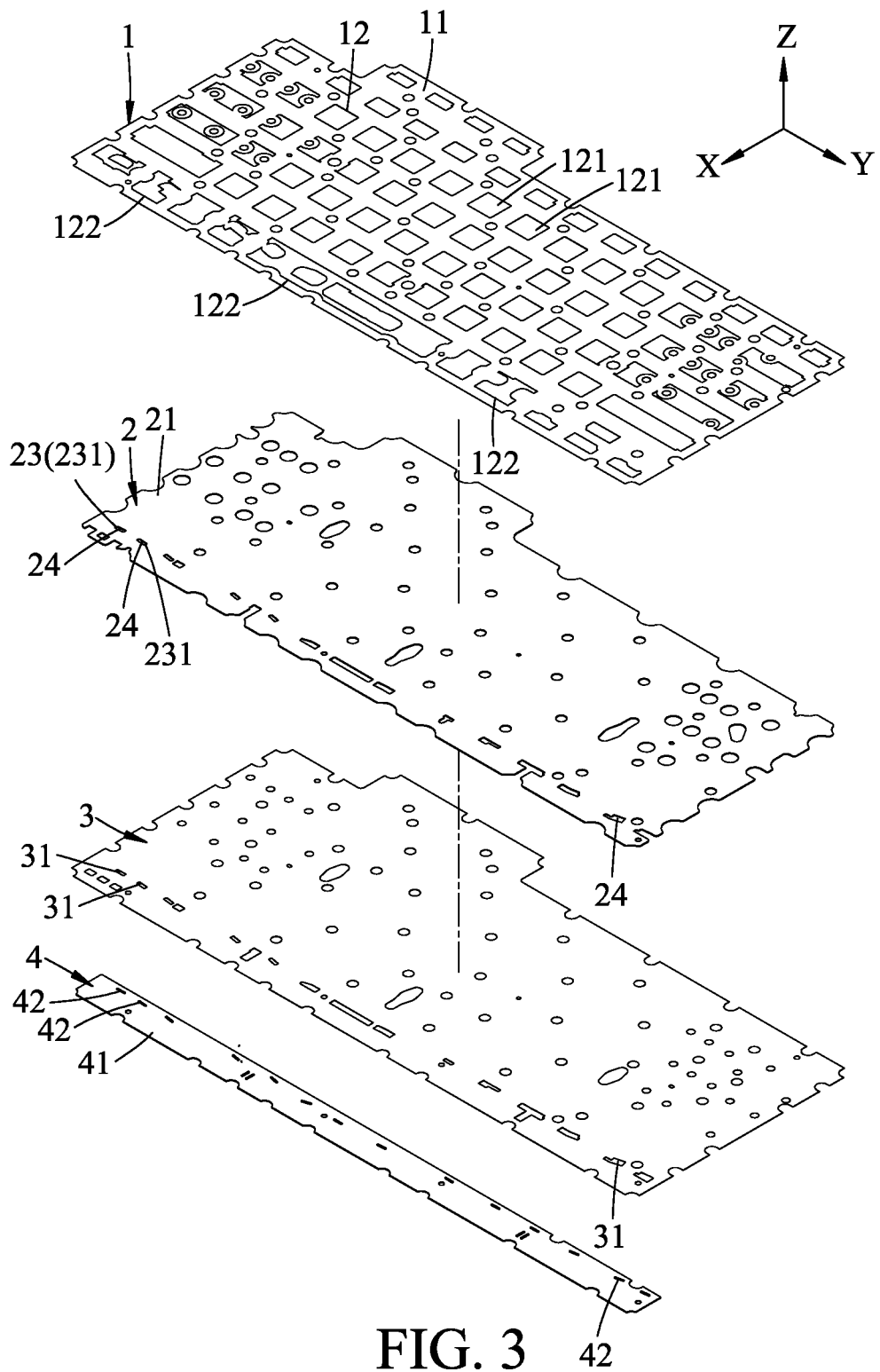
FIG. 3 is an exploded perspective view of the embodiment.

Referring to FIGS. 1 to 3, a light emitting module according to an embodiment of the disclosure is adapted to be mounted in a luminous keyboard (not shown). The luminous keyboard includes a plurality of keycaps (not shown). The light emitting module of the disclosure includes a light-shielding plate 1, a light-guiding plate 2, a reflection plate 3, and a light source unit 4.

As shown in FIGS. 2 and 3, the light-shielding plate 1 includes a light-shielding portion 11 and a hollow unit 12 that is formed in the light-shielding portion 11. The hollow unit 12 extends through the light-shielding portion 11 in a top-bottom direction (Z).

The hollow unit 12 has a plurality of first hollow portions 121 and a plurality of second hollow portions 122. The first hollow portions 121 and the second hollow portions 122 are respectively situated under the keycaps in the top-bottom direction (Z).

Figure 4:
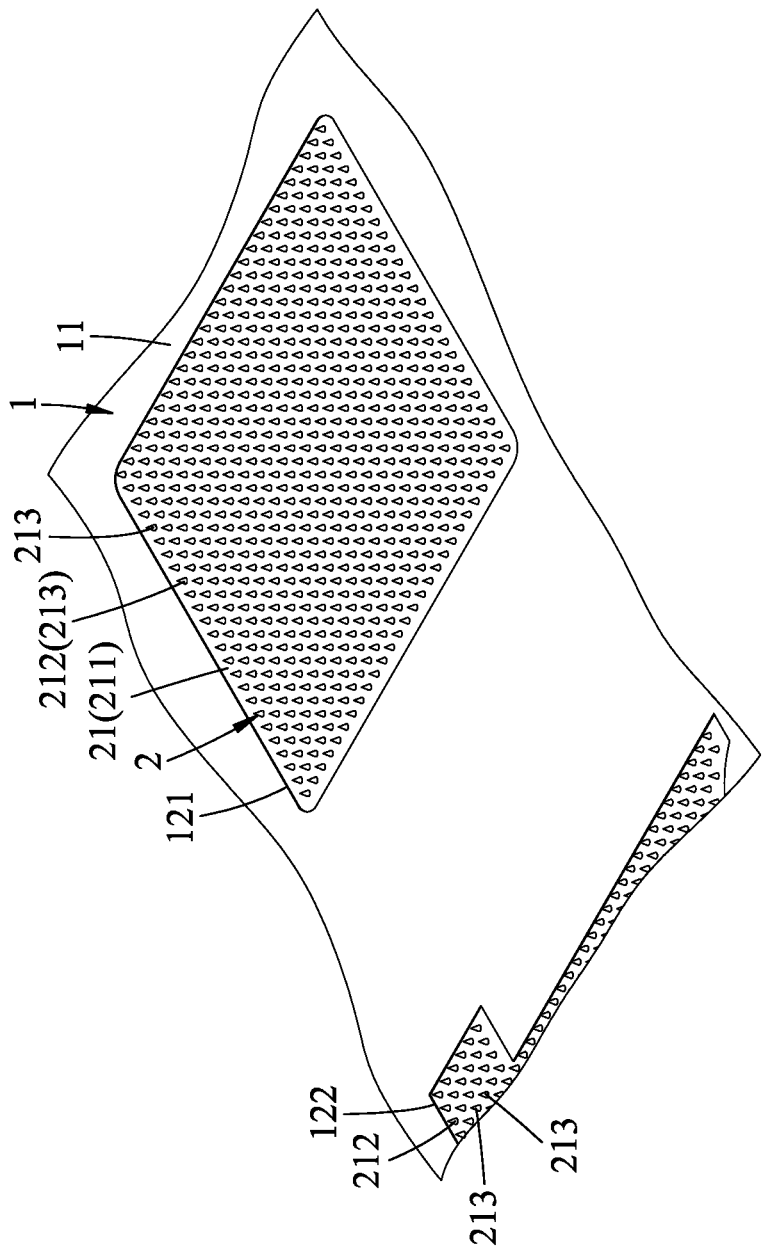
FIG. 4 is a partly enlarged fragmentary perspective view of FIG. 1.
Figure 5:
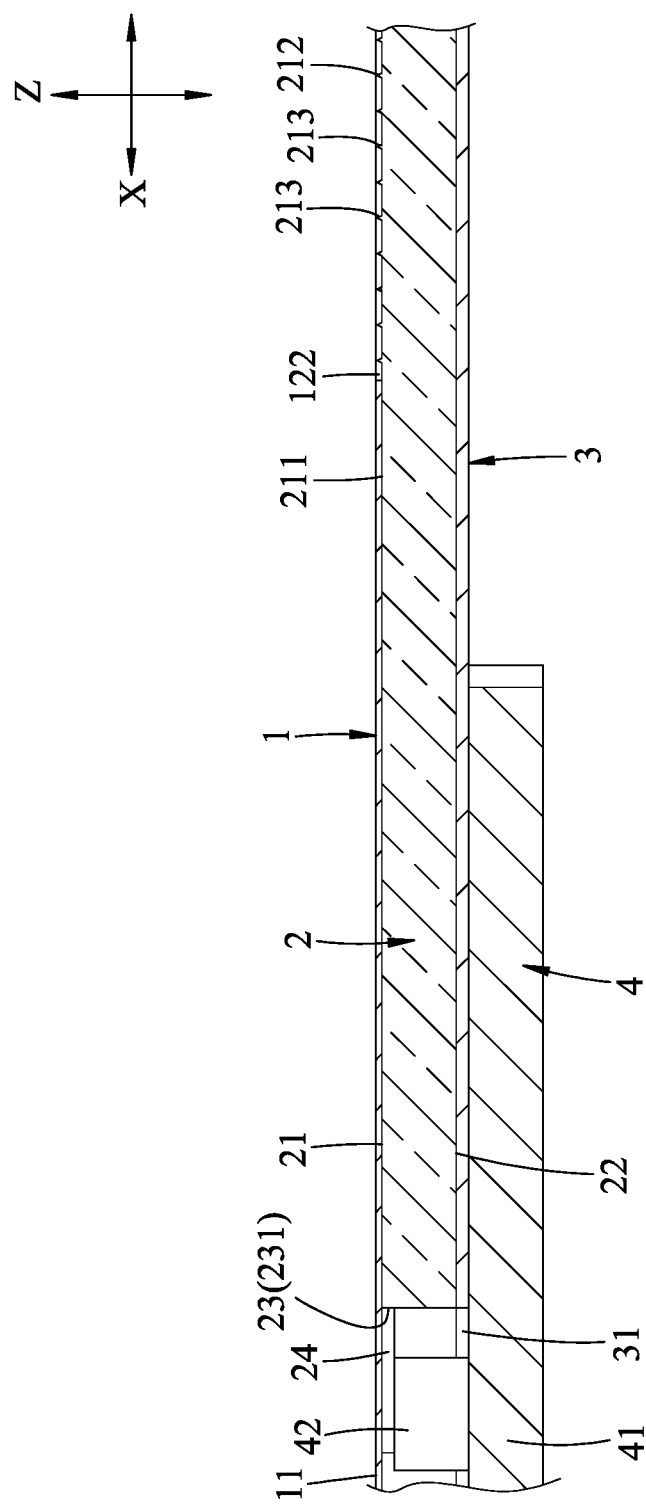
FIG. 5 is an enlarged fragmentary sectional view taken along line V-V of FIG. 2.

Referring to FIGS. 4 and 5 in combination with FIG. 3, the light-guiding plate 2 is made of a light permeable material and is disposed under the light-shielding plate 1. The light-guiding plate 2 has a light-exiting surface 21, a bottom surface 22, and a light-entering surface unit 23. The bottom surface 22 is opposite to the light-exiting surface 21. The light-entering surface unit 23 is connected between the light-exiting surface 21 and the bottom surface 22.

The light-exiting surface 21 is disposed adjacent to the light-shielding plate 1, and has a base portion 211 and at least one light-mixing portion 212. The at least one light-mixing portion 212 is formed on the base portion 211, and is disposed within the hollow unit 12. In this embodiment, the at least one light-mixing portion 212 includes a plurality of light-mixing portions 212 that are respectively disposed in the first hollow portions 121 and the second hollow portions 122.

Each of light-mixing portions 212 has a plurality of refracting segments 213. The refracting segments 213 are spaced apart from each other.

Figure 6:
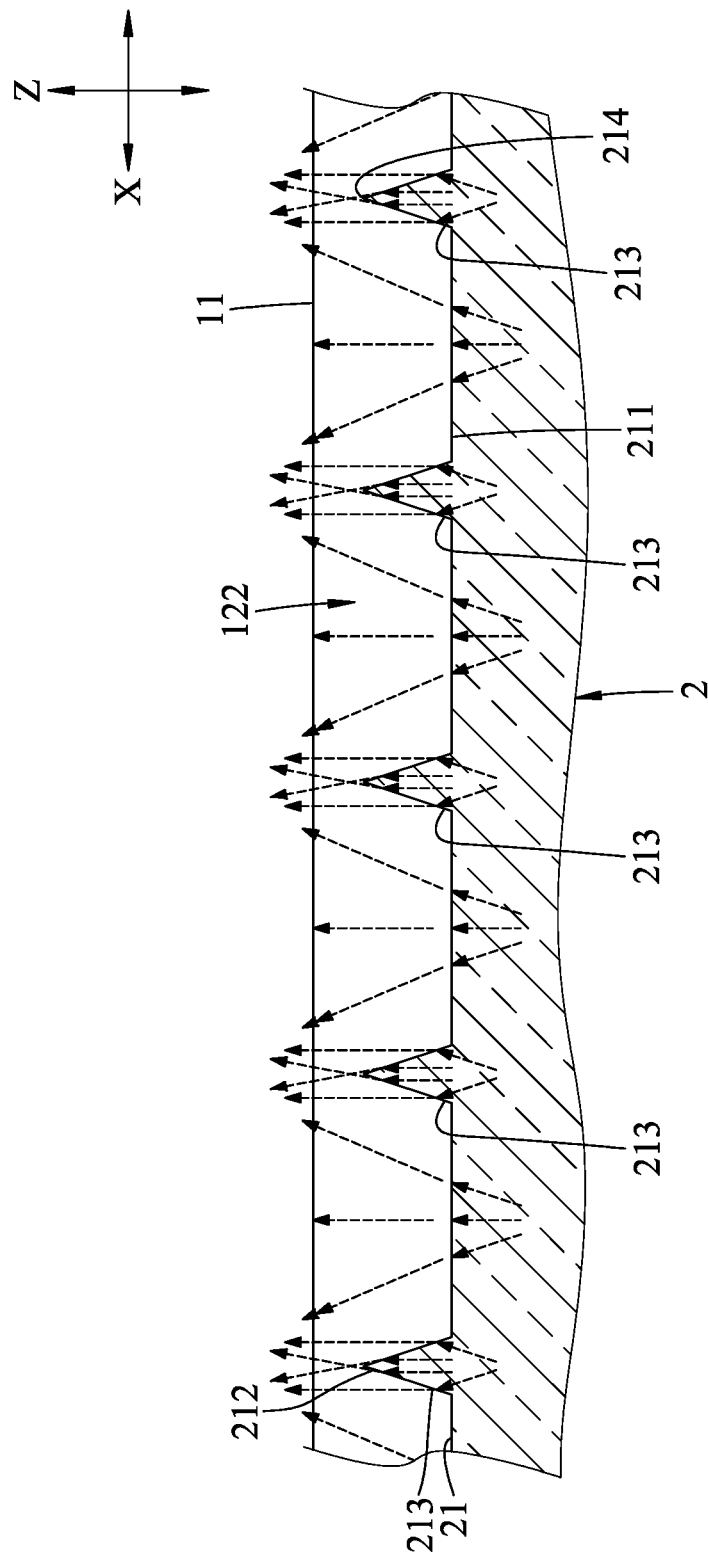
FIG. 6 is a partly enlarged fragmentary sectional view of FIG. 5.

Referring to FIG. 6 in combination with FIGS. 4 and 5, each of the refracting segments 213 extends and tapers upwardly from the base portion 211 in the top-bottom direction (Z). Each of the refracting segments 213 has a pointed end 214 that is distal from the base portion 211. In this embodiment, each of the refracting segments 213 has a conical shape, but a shape of each of the refracting segments 213 is not limited hereto. In some other embodiments, each of the refracting segments 213 may have a polygonal pyramid shape.

As shown in FIGS. 3 and 5, the light-entering surface unit 23 of the light-guiding plate 2 has a plurality of light-entering surfaces 231. Each of the light-entering surfaces 231 defines a through channel 24 that extends through the light-exiting surface 21 and the bottom surface 22 in the top-bottom direction (Z). The through channels 24 defined by the light-entering surfaces 231 are arranged in a row and disposed adjacent to one of a front edge and a rear edge of the light-guiding plate 2 along a front-rear direction (X) perpendicular to the top-bottom direction (Z). The through channels 24 are spaced apart from each other in a left-right direction (Y) perpendicular to the top-bottom direction (Z) and the front-rear direction (X).

The reflection plate 3 is disposed under the bottom surface 22 of the light-guiding plate 2. The reflection plate 3 has a plurality of through holes 31 that are respectively aligned with the through channels 24 defined by the light-entering surfaces 231 of the light-guiding plate 2. In this embodiment, the reflection plate 3 further has front and rear edges that are opposite to each other in the front-rear direction (X).

The light source unit 4 includes a circuit board 41 and a plurality of light emitting members 42.

The circuit board 41 is disposed under a side of the reflection plate 3, is disposed between the front and rear edges of the reflection plate 3 and adjacent to one of the front and rear edges of the reflection plate 3, and is elongated in the left-right direction (Y). In this embodiment, the circuit board 41 is a flexible printed circuit board.

As shown in FIGS. 2, 3, and 5, the light emitting members 42 are disposed on the circuit board 41 and are spaced apart from each other in the left-right direction (Y). In this embodiment, the light emitting members 42 are disposed below the light-shielding portion 11. The second hollow portions 122 is disposed adjacent to the light emitting members 42, and the light-entering surface unit 23 faces the light emitting members 42. Each of the light emitting members 42 extends into a respective one of the through channels 24 through a respective one of the through holes 31 and is surrounded by the respective one of the light-entering surfaces 231. Each of the second hollow portions 122 at least partly surrounds a corresponding one of the light emitting members 42. The circuit board 41, the reflection plate 3, the light-guiding plate 2, and the light-shielding plate 1 are stacked sequentially on one another in the top-bottom direction (Z).

In this embodiment, each of the light emitting members 42 is an RGB light emitting diode so as to be modulated for emission of red light, green light, and blue light or for mixing light beams formed by red light, green light, blue light in different proportions.

Described below will be the light beams generated from the light emitting members 42 through the light-entering surface unit 23 to illuminate the light-guiding plate 2.

As shown in FIGS. 5 and 6, multiple light beams emitted from the light emitting members 42 are as shown by dashed arrows, in which each of the light beams may be red, green, or blue, or be in a color mixed by red, green, and blue. After the reflection plate 3 reflects the light beams emitted from the light emitting members 42 to the base portions 211, the light beams are crossed and mixed by the refracting segments 213, and pass through the second hollow portions 122 to illuminate the keycaps (not shown). By virtue of the pointed ends 214 of the refracting segments 213 gathering the light beams reflected by the reflection plate 3, the light beams are more densely crossed and mixed by the light-mixing portions 212. As a result, luminance provided by the light-mixing portions 212 may be increased, and an enhanced mixing light effect may be achieved by the light-mixing portions 212, thereby reducing an incomplete mixture of the light beams in different colors. In particular, the mixing light effect on the second hollow portions 122 that are disposed adjacent to the light emitting members 42 is conspicuously improved. In addition, based on different requirements, the refracting segments 213 in different shapes or quantities may be disposed in the first hollow portions 121 that are differently located and the second hollow portions 122 that are differently located, so as to adjust the mixing light effect or the luminance.

In summary, by virtue of the refracting segments 213 gathering the light beams, the luminance and a mixing light degree of the hollow unit 12 may be enhanced to reduce the incomplete mixture of the light beams in different colors. By virtue of the refracting segments 213 that are to be disposed in the first hollow portions 121 and the second hollow portions 122 in different locations, the mixing light effect or the luminance may be adjusted.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting module adapted to be mounted in a luminous keyboard, said light emitting module comprising:
   a light-shielding plate including a light-shielding portion and a hollow unit that is formed in said light-shielding portion, said hollow unit extending through said light-shielding portion in a top-bottom direction;
   a light-guiding plate made of a light permeable material and disposed under said light-shielding plate, said light-guiding plate having
      a light-exiting surface that is disposed adjacent to said light-shielding plate, and that has a base portion and at least one light-mixing portion, said at least one light-mixing portion being formed on said base portion, being disposed within said hollow unit, and having a plurality of refracting segments, each of said refracting segments extending and tapering upwardly from said base portion in the top-bottom direction,
      a bottom surface that is opposite to said light-exiting surface, and
      a light-entering surface unit that is connected between said light-exiting surface and said bottom surface;
   a reflection plate disposed under said bottom surface; and
   a light source unit including a plurality of light emitting members that are disposed below said light-shielding portion, said light-entering surface unit facing said light emitting members.

2. The light emitting module as claimed in claim 1, wherein each of said refracting segments has a pointed end that is distal from said base portion.

3. The light emitting module as claimed in claim 1, wherein each of said refracting segments has a conical shape.

4. The light emitting module as claimed in claim 1, wherein said refracting segments are spaced apart from each other.

5. The light emitting module as claimed in claim 1, wherein:
   said hollow unit has a plurality of first hollow portions and a plurality of second hollow portions, said second hollow portions being disposed adjacent to said light emitting members;
   each of said second hollow portions at least partly surrounds a corresponding one of said light emitting members; and
   said at least one light-mixing portion includes a plurality of light-mixing portions that are respectively disposed in said first hollow portions and said second hollow portions.

6. The light emitting module as claimed in claim 1, wherein:
   said light-entering surface unit of said light-guiding plate has a plurality of light-entering surfaces, each of said light-entering surfaces defining a through channel that extends through said light-exiting surface and said bottom surface in the top-bottom direction;
   said reflection plate has a plurality of through holes that are respectively aligned with said through channels defined by said light-entering surfaces; and
   each of said light emitting members extends into a respective one of said through channels through a respective one of said through holes and is surrounded by the respective one of said light-entering surfaces.

7. The light emitting module as claimed in claim 1, wherein each of said light emitting members is an RGB light emitting diode.

8. The light emitting module as claimed in claim 7, wherein:
   said reflection plate has front and rear edges that are opposite to each other in a front-rear direction perpendicular to the top-bottom direction;
   said light source unit further includes a circuit board that is disposed under a side of said reflection plate, that is disposed between said front and rear edges of said reflection plate and adjacent to one of said front and rear edges of said reflection plate, and that is elongated in a left-right direction perpendicular to the top-bottom direction and the front-rear direction; and
   said light emitting members are disposed on said circuit board and are spaced apart from each other in the left-right direction.

* * * * *